US008917195B2

(12) United States Patent
Motz et al.

(10) Patent No.: US 8,917,195 B2
(45) Date of Patent: *Dec. 23, 2014

(54) SYSTEM INCLUDING FEEDBACK CIRCUIT WITH DIGITAL CHOPPING CIRCUIT

(75) Inventors: Mario Motz, Wernberg (AT); Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 304 days.

This patent is subject to a terminal disclaimer.

(21) Appl. No.: 13/527,120

(22) Filed: Jun. 19, 2012

(65) Prior Publication Data

US 2012/0262317 A1 Oct. 18, 2012

Related U.S. Application Data

(63) Continuation of application No. 12/717,294, filed on Mar. 4, 2010, now Pat. No. 8,203,471.

(51) Int. Cl.
*H03M 1/00* (2006.01)
*H03M 1/02* (2006.01)

(52) U.S. Cl.
CPC ..................................... *H03M 1/02* (2013.01)
USPC ............................. 341/110; 341/144; 341/143

(58) Field of Classification Search
USPC .................................................. 341/110–155
See application file for complete search history.

(56) References Cited

U.S. PATENT DOCUMENTS

| 5,159,198 | A | * | 10/1992 | Kohsaka et al. | 250/330 |
|---|---|---|---|---|---|
| 5,459,432 | A | | 10/1995 | White et al. | |
| 6,674,322 | B2 | | 1/2004 | Motz et al. | |
| 7,098,827 | B2 | | 8/2006 | Motz | |
| 7,358,880 | B1 | | 4/2008 | Melanson | |
| 7,474,247 | B1 | * | 1/2009 | Heinks et al. | 341/155 |
| 7,479,910 | B1 | * | 1/2009 | Heinks et al. | 341/143 |
| 7,545,303 | B1 | | 6/2009 | Silva et al. | |
| 7,623,053 | B2 | * | 11/2009 | Terry et al. | 341/143 |
| 8,203,471 | B2 | * | 6/2012 | Motz et al. | 341/110 |
| 2009/0079607 | A1 | | 3/2009 | Denison et al. | |

FOREIGN PATENT DOCUMENTS

WO 2008/093276 8/2008

OTHER PUBLICATIONS

Notice of Allowance mailed Feb. 21, 2012 in U.S. Appl. No. 12/717,294.

* cited by examiner

*Primary Examiner* — Lam T Mai
(74) *Attorney, Agent, or Firm* — Dicke, Billig & Czaja, PLLC (57) ABSTRACT

A system including a first circuit, a second circuit, and a feedback circuit. The first circuit is configured to provide input signals. The second circuit is configured to receive the input signals and provide digital output signals that correspond to the input signals. The feedback circuit includes a chopping circuit, an integrator circuit, and a digital to analog converter circuit. The digital to analog converter circuit is configured to convert an error signal into an analog signal that is received by the second circuit to reduce ripple error.

10 Claims, 4 Drawing Sheets

SYSTEM INCLUDING FEEDBACK CIRCUIT WITH DIGITAL CHOPPING CIRCUIT

CROSS-REFERENCE TO RELATED APPLICATIONS

This Utility Patent Application is a continuation application of U.S. application Ser. No. 12/717,294, filed Mar. 4, 2010, which is incorporated herein by reference.

BACKGROUND

Sensors come in many shapes and sizes, from motion detectors that signal lights to go on when we enter a room to Geiger counters that detect radiation loss. Sensors are used in commercial, industrial, and personal applications including cars, machines, aerospace, medicine, manufacturing, and robotics. Often, sensors help regulate and control existing operations, such as proximity sensors that assist in aircraft and marine applications and speed and position sensors that assist in automotive engine management. Current sensors monitor AC and/or DC current for different electrical systems. Some current sensors provide highly accurate current measurement values and other current sensors quickly detect a high overdrive (ODR) current.

Often, sensor signals are small, such that sensors need to have very low offset values and very low noise values. Sometimes, to reduce offset errors, preamplifiers or analog to digital converter (ADC) input stages chop or modulate the input signal. However, chopping the input signal causes high frequency chopper noise that needs to be filtered, which consumes area on the integrated circuit chip. Also, dynamic error effects convert the high frequency chopper noise to signal frequencies and cause residual offsets and in-band noise, which reduces the dynamic range of the sensor and increases the ratio of the smallest accurate signal to the biggest signal. Analog feedback loops can be used to reduce offset error. But, analog feedback loops consume more area on the integrated circuit chip, where the low-pass filtering frequency is small in comparison to the chopper frequency to avoid influencing the signal in the forward path.

For these and other reasons there is a need for the present invention.

SUMMARY

One embodiment described in the disclosure provides a system including a first circuit, a second circuit, and a feedback circuit. The first circuit is configured to provide input signals. The second circuit is configured to receive the input signals and provide digital output signals that correspond to the input signals. The feedback circuit includes a chopping circuit, an integrator circuit, and a digital to analog converter circuit. The chopping circuit is configured to receive the digital output signals and provide error signals that represent ripple error in the digital output signals. The integrator circuit is configured to accumulate the error signals and provide an accumulated error signal. The digital to analog converter circuit is configured to convert the accumulated error signal into an analog signal that is received by the second circuit to reduce the ripple error.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Figure 1:
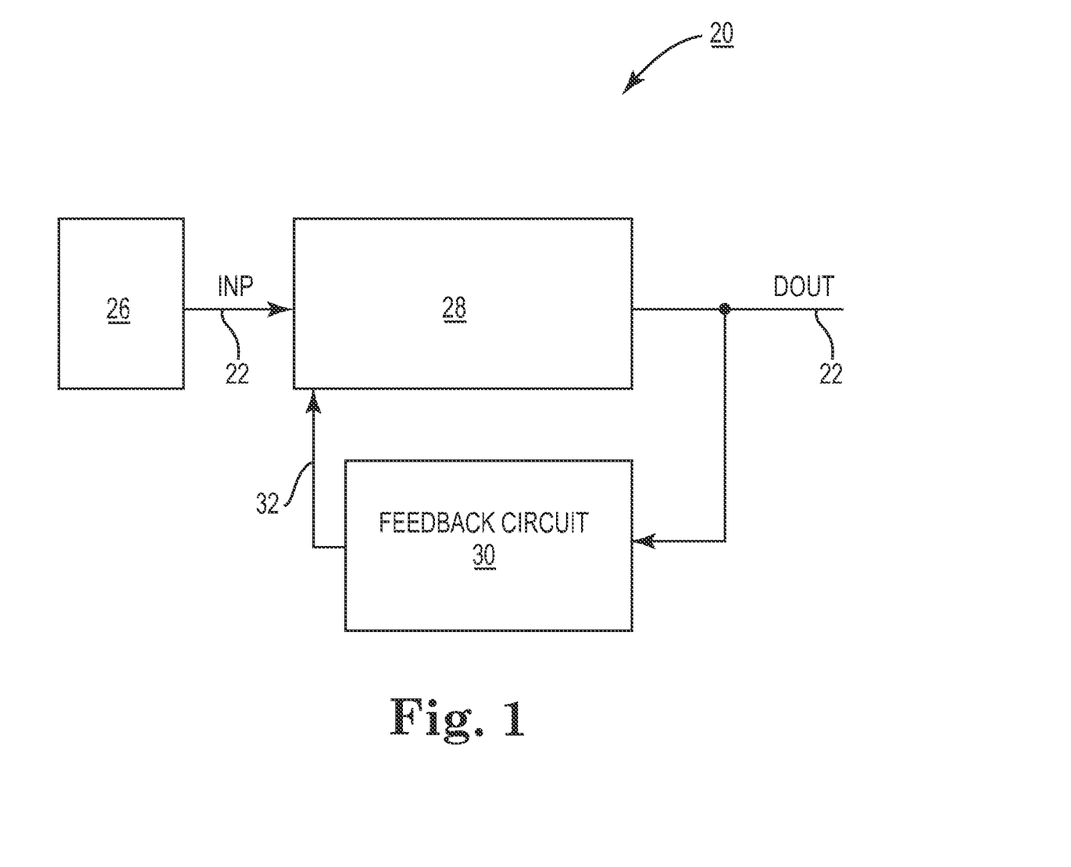
FIG. 1 is a diagram illustrating one embodiment of a system.

FIG. 1 is a diagram illustrating one embodiment of a system 20 that receives input signals INP at 22 and provides corresponding digital output signals DOUT at 24. System 20 chops the input signals INP at 22 to reduce offset errors and feeds back the digital output signals DOUT at 24 to reduce ripple error that includes chopping errors in the digital output signals DOUT at 24. In one embodiment, system 20 is a sensor system. In one embodiment, system 20 is a magnetic sensor system that magnetically senses something, such as current. In one embodiment, system 20 is a Hall plate sensor system. In one embodiment, system 20 is a spinning Hall plate sensor system.

System 20 includes a first circuit 26, a second circuit 28, and a feedback circuit 30. First circuit 26 is electrically coupled to second circuit 28 via input signal path 22. Second circuit 28 is electrically coupled to one side of feedback circuit 30 via output signal path 24 and to the other side of feedback circuit 30 via analog feedback path 32.

First circuit 26 provides input signals INP at 22. In one embodiment, first circuit 26 is a sensor circuit that senses and provides sensed input signals INP at 22. In one embodiment, first circuit 26 is a magnetic sensor circuit that magnetically senses something, such as current, and provides sensed input signals INP at 22. In one embodiment, first circuit 26 is a Hall plate sensor circuit that provides sensed input signals INP at 22. In one embodiment, first circuit 26 is a spinning Hall plate sensor circuit that senses a magnetic field and provides input signals INP at 22, which correspond to the magnetic field.

Second circuit 28 receives the input signals INP at 22 and provides the digital output signals DOUT at 24 that correspond to the input signals INP at 22. Second circuit 28 chops the input signals INP at 22 and second circuit 28 includes an analog to digital converter (ADC) that converts the chopped input signals INP at 22 to the digital output signals DOUT at 24. The digital output signals DOUT at 24 include a DC signal component overlaid with an AC error signal that includes a chopping error signal at the chopper frequency. This AC error signal in the digital output signal DOUT at 24 is a ripple error signal. The digital output signals DOUT at 24 are fed back to an input stage of second circuit 28 to reduce the ripple error signal in the digital output signals DOUT at 24.

Feedback circuit 30 receives the digital output signals DOUT at 24 and provides an analog feedback signal at 32 to second circuit 28. Feedback circuit 30 receives the digital output signals DOUT at 24 and generates DC error signals that represent the AC ripple error in the digital output signals DOUT at 24. In one embodiment, feedback circuit 30 digitally chops the digital output signals DOUT at 24 and the AC ripple error is converted into DC rectified ripple error signals. In one embodiment, feedback circuit 30 includes a digital chopping circuit that receives the digital output signals DOUT at 24 and provides DC rectified ripple error signals that represent the AC ripple error in the digital output signals DOUT at 24. In one embodiment, second circuit 28 and/or feedback circuit 30 chop at higher frequencies during a system start up period and at lower frequencies after the system start up period, where chopping at lower frequencies reduces chopping noise and error. In one embodiment, second circuit 28 and/or feedback circuit 30 chops at higher frequencies for larger input signals and at lower frequencies for smaller input signals, as chopping at lower frequencies reduces chopping noise and error.

Feedback circuit 30 accumulates the DC error signals and provides an accumulated error signal that is converted into the analog feedback signal at 32. Second circuit 28 receives the analog feedback signal at 32 and reduces the ripple error in the digital output signals DOUT at 24. In one embodiment, feedback circuit 30 includes an integrator circuit configured to accumulate the error signals and provide an accumulated error signal. In one embodiment, feedback circuit 30 includes a digital to analog converter (DAC) circuit that converts the accumulated error signal into an analog feedback signal at 32 that is received by the second circuit 28 to reduce the ripple error. In one embodiment, feedback circuit 30 freezes the accumulated error signal for a period of time, such as seconds or minutes.

Figure 2:
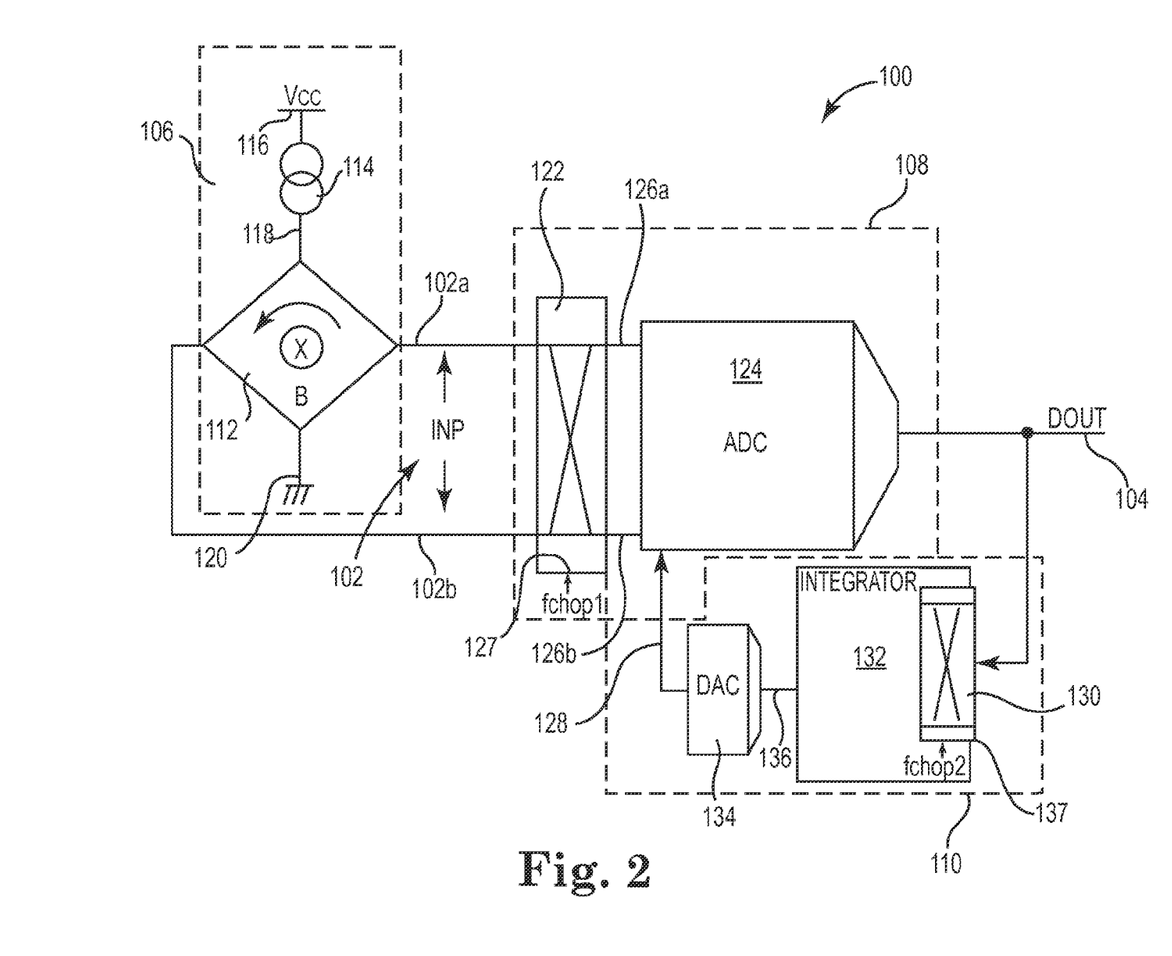
FIG. 2 is a diagram illustrating one embodiment of a sensor system that senses magnetic fields.

FIG. 2 is a diagram illustrating one embodiment of a sensor system 100 that senses magnetic fields. Sensor system 100 provides input signals INP at 102 that correspond to a sensed magnetic field B and digital output signals DOUT at 104 that correspond to the input signals INP at 102. Sensor system 100 chops the input signals INP at 102 to reduce offset errors and feeds back the digital output signals DOUT at 104 to reduce ripple error including chopping errors in the digital output signals DOUT at 104. In one embodiment, sensor system 100 is configured to magnetically sense current.

Sensor system 100 includes a spinning Hall plate sensor system 106, a chopped ADC 108, and a digitally chopped feedback circuit 110. Sensor system 100 is one embodiment of system 20, where the spinning Hall plate sensor system 106 is an embodiment of first circuit 26, the chopped ADC 108 is an embodiment of second circuit 28, and the digitally chopped feedback circuit 110 is an embodiment of feedback circuit 30.

Spinning Hall plate sensor system 106 includes a spinning Hall plate sensor 112 in a magnetic field B and a current source 114. One side of current source 114 is electrically coupled to power VCC at 116 and the other side of current source 114 is electrically coupled to spinning Hall plate sensor 112 via spinning Hall plate contact 118. Spinning Hall plate sensor 112 is electrically coupled to a reference, such as ground, via another spinning Hall plate contact 120. Spinning Hall plate sensor 112 is electrically coupled to chopped ADC 108 via input signal path 102$a$ and input signal path 102$b$. The spinning Hall plate contacts 118 and 120 and input signal paths 102$a$ and 102$b$ rotate, from one corner to another corner of the spinning Hall plate sensor 112, to spin the sensor for reducing offset signals.

Chopped ADC 108 includes an analog chopping circuit 122 and an ADC 124. Analog chopping circuit 122 is electrically coupled to spinning Hall plate sensor 112 via input signal path 102$a$ and input signal path 102$b$. The other side of analog chopping circuit 122 is electrically coupled to ADC 124 via converter input paths 126$a$ and 126$b$. Analog chopping circuit 122 receives chopping signal fchop1 at 127. ADC 124 is electrically coupled to one side of digitally chopped feedback circuit 110 via digital output signal path 104 and to the other side of digitally chopped feedback circuit 110 via analog feedback signal path 128.

Digitally chopped feedback circuit 110 includes a digital chopping circuit 130, an integrator circuit 132, and a DAC circuit 134. Digital chopping circuit 130 is electrically coupled to ADC 124 via digital output signal path 104. The other side of digital chopping circuit 130 is electrically coupled to integrator circuit 132, which is electrically coupled to the digital input side of DAC circuit 134 via DAC input path 136. Digital chopping circuit 130 receives chopping signal fchop2 at 137. The analog output of DAC circuit 134 is electrically coupled to ADC 124 via analog feedback signal path 128.

Spinning Hall plate sensor system 106 provides input signals INP at 102. Current source 114 provides a current through spinning Hall plate sensor 112 that is situated in magnetic field B. Spinning Hall plate sensor 112 senses magnetic field B and provides input signals INP at 102 that correspond to magnetic field B. Spinning Hall plate contacts 118 and 120 and input signal paths 102$a$ and 102$b$ are rotated from one corner to another corner of the spinning Hall plate sensor 112 to spin the sensor in magnetic field B for reducing offset signals. In one embodiment, magnetic field B corresponds to a current and spinning Hall plate sensor system 106 magnetically senses the current and provides the corresponding sensed input signals INP at 102.

Chopped ADC 108 receives the input signals INP at 102 and provides the digital output signals DOUT at 104 that correspond to the input signals INP at 102. Analog chopping circuit 122 chops the input signals INP at 102 at a chopping frequency to produce chopped or modulated input signals. ADC 124 receives the chopped or modulated input signals and converts the chopped input signals into the digital output signals DOUT at 104. The digital output signals DOUT at 104 include a DC signal component overlaid with an AC error signal that includes a chopping error at the chopper frequency. This AC error signal in the digital output signal DOUT at 104 is a ripple error signal. In one embodiment, ADC 124 is only an ADC. In one embodiment, ADC 124 is a continuous time, sigma delta ADC.

Digitally chopped feedback circuit 110 receives the digital output signals DOUT at 104 and provides an analog feedback signal at 128 to ADC 124. Digital chopping circuit 130 receives the digital output signals DOUT at 104 and provides DC error signals that represent the AC ripple error in the digital output signals DOUT at 104. In one embodiment, analog chopping circuit 122 and digital chopping circuit 130 chop at synchronized chopping frequencies, such as integer multiples of one another. In one embodiment, analog chopping circuit 122 and digital chopping circuit 130 chop at the same chopping frequency. In one embodiment, analog chopping circuit 122 and/or digital chopping circuit 130 chop at higher frequencies during a system start up period and at lower frequencies after the system start up period, such as after the feedback loop has settled, where chopping at lower frequencies reduces chopping noise and error. In one embodiment, analog chopping circuit 122 and/or digital chopping circuit 130 chops at higher frequencies for larger input signals INP at 102 and at lower frequencies for smaller input signals INP at 102, where chopping at lower frequencies reduces chopping noise and error.

To provide DC error signals with smaller chopping peaks, chopping of analog chopping circuit 122 via chopping signal fchop1 and chopping of digital chopping circuit 130 via chopping signal fchop2 is controlled to compensate for the delay through ADC 124 and the settling time of ADC 124. In one embodiment, chopping signal fchop2 is delayed in relation to chopping signal fchop1 to compensate for the delay of ADC 124 and the settling time of ADC 124. In one embodiment, chopping of digital chopping circuit 130 via chopping signal fchop2 is guardbanded to prevent signals from passing through digital chopping circuit 130 during the delay and settling time of ADC 124 after switching analog chopping circuit 122. In one embodiment, chopping signal fchop2 at 137 is delayed in relation to chopping signal fchop1 at 127 via a delay circuit between signal lines 127 and 137. In one embodiment, chopping signal fchop2 at 137 is guardbanded in relation to chopping signal fchop1 at 127 via a guardbanding circuit.

In one embodiment, digital chopping circuit 130 multiplies one value of the digital output signals DOUT at 104 by plus (or positive) one in one chopping phase and the next value of the digital output signals DOUT at 104 by minus (or negative) one in the next chopping phase, where digital chopping circuit 130 alternates between multiplying the digital output signals DOUT at 104 by positive one and multiplying the digital output signals DOUT at 104 by negative one during different chopping phases. Digital chopping circuit 130 sums multiplication results in consecutive chopping phases to provide the DC error signals. In one embodiment, digital chopping circuit 130 multiplies the digital output signals DOUT at 104 by negative one via inverting the digital output signals DOUT at 104.

Integrator circuit 132 receives the DC error signals from digital chopping circuit 130 and accumulates the DC error signals to provide an accumulated error signal at 136. In one embodiment, integrator circuit 132 digitally sums the DC error signals to provide the accumulated error signal. In other embodiments, integrator circuit 132 can be any suitable low pass filter.

DAC circuit 134 receives the accumulated error signal and converts the accumulated error signal into an analog feedback signal at 128. ADC 124 receives the analog feedback signal at 128 and reduces ripple error in the digital output signals DOUT at 104. This process continues, where the accumulated error signal continues to accumulate and the analog feedback signal at 128 is adjusted accordingly to eliminate or reduce ripple error including chopping error in the digital output signals DOUT at 104. In one embodiment, integrator circuit 132 freezes the accumulated error signal for a period of time, such as seconds or minutes, which stabilizes the circuit. In one embodiment, DAC circuit 134 includes a current steering circuit for providing the analog feedback signal at 128 to ADC 124. In one embodiment, DAC circuit 134 includes a pulse width DAC for providing the analog feedback signal at 128 to ADC 124. In one embodiment, DAC circuit 134 includes a voltage divider circuit for providing the analog feedback signal at 128 to ADC 124.

Figure 3:
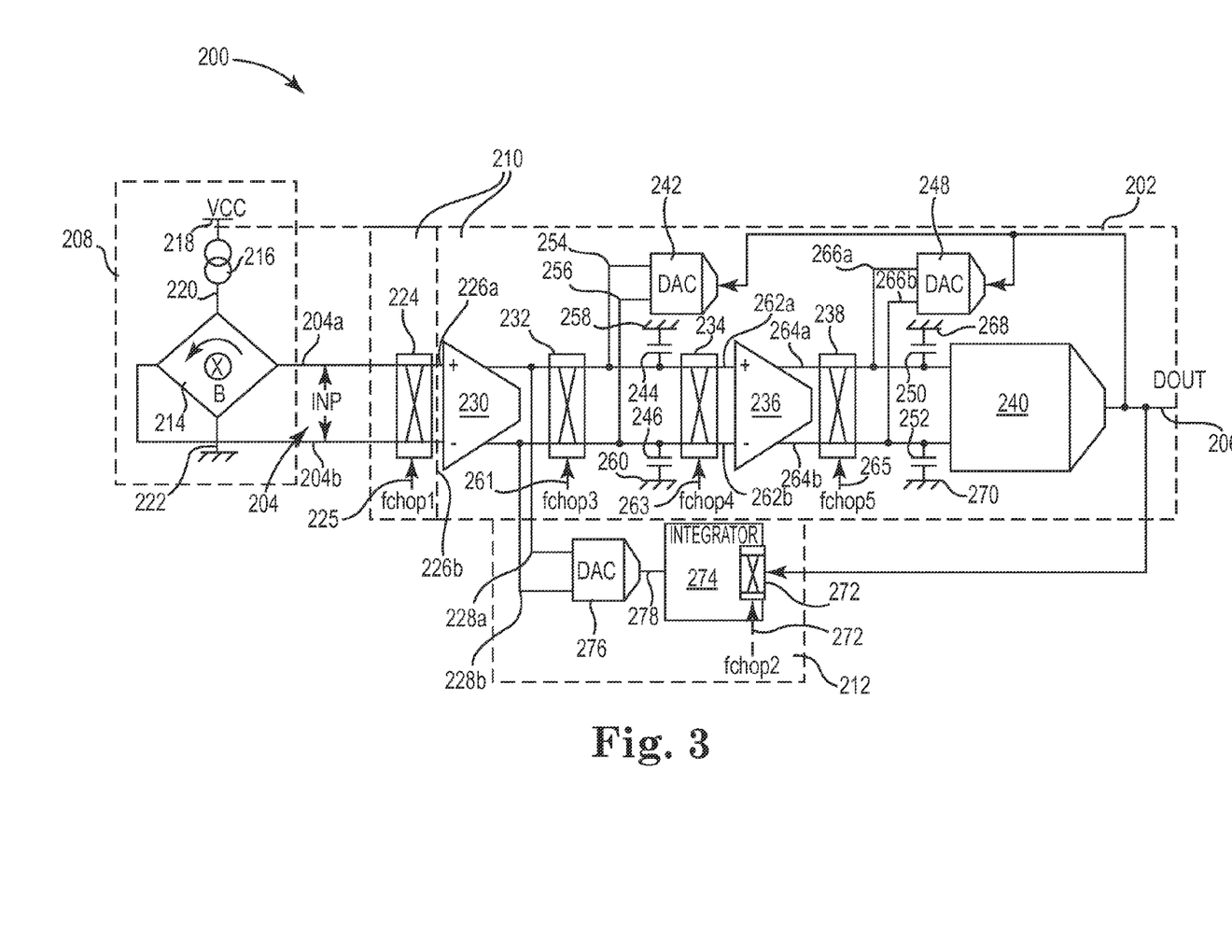
FIG. 3 is a diagram illustrating one embodiment of a sensor system that includes a chopped, sigma delta ADC.

FIG. 3 is a diagram illustrating one embodiment of a sensor system 200 that includes a chopped, sigma delta ADC 202. Sensor system 200 provides input signals INP at 204 that correspond to a sensed magnetic field B and digital output signals DOUT at 206 that correspond to the input signals INP at 204. Sensor system 200 chops the input signals INP at 204 to reduce offset errors and feeds back the digital output signals DOUT at 206 to reduce ripple error including chopping errors in the digital output signals DOUT at 206. In one embodiment, sensor system 200 is configured to magnetically sense current.

Sensor system 200 includes a spinning Hall plate sensor system 208, a chopped ADC 210, and a digitally chopped feedback circuit 212. Sensor system 200 is one embodiment of system 20, where the spinning Hall plate sensor system 208 is an embodiment of first circuit 26, the chopped ADC 210 is an embodiment of second circuit 28, and the digitally chopped feedback circuit 212 is an embodiment of feedback circuit 30.

Spinning Hall plate sensor system 208 includes a spinning Hall plate sensor 214 in a magnetic field B and a current source 216. One side of current source 216 is electrically coupled to power VCC at 218 and the other side of current source 216 is electrically coupled to spinning Hall plate sensor 214 via spinning Hall plate contact 220. Spinning Hall plate sensor 214 is electrically coupled to a reference, such as ground, via another spinning Hall plate contact 222. Spinning Hall plate sensor 214 is electrically coupled to chopped ADC 210 via input signal path 204a and input signal path 204b. The spinning Hall plate contacts 220 and 222 and input signal paths 204a and 204b rotate, from one corner to another corner of the spinning Hall plate sensor 214, to spin the sensor for reducing offsets.

Chopped ADC 210 includes an analog chopping circuit 224 and chopped, sigma delta ADC 202. Analog chopping circuit 224 receives chopping signal fchop1 at 225 and is electrically coupled to spinning Hall plate sensor 214 via input signal path 204a and input signal path 204b. The other side of analog chopping circuit 224 is electrically coupled to chopped, sigma delta ADC 202 via converter input paths 226a and 226b. Chopped, sigma delta ADC 202 is electrically coupled to one side of digitally chopped feedback circuit 212 via digital output signal path 206 and to the other side of digitally chopped feedback circuit 212 via analog feedback signal paths 228a and 228b.

Chopped, sigma delta ADC 202 includes a first transconductance amplifier 230, a first chopper switch 232, a second chopper switch 234, a second transconductance amplifier 236, a third chopper switch 238, and a digital output circuit 240. Chopped, sigma delta ADC 202 also includes a first DAC 242, first capacitors 244 and 246, a second DAC 248, and second capacitors 250 and 252. First transconductance amplifier 230 is electrically coupled to analog chopping circuit 224 via converter input paths 226a and 226b. The outputs of first transconductance amplifier 230 are electrically coupled to first chopper switch 232 and digitally chopped feedback circuit 212 via analog feedback signal paths 228a and 228b. The outputs of first chopper switch 232 are electrically coupled to second chopper switch 234, first capacitors 244 and 246, and the analog outputs of first DAC 242 via signal paths 254 and 256. The other sides of first capacitors 244 and 246 are electrically coupled to references, such as ground, at 258 and 260, respectively. First chopper switch 232 receives chopping signal fchop3 at 261 and second chopper switch 234 receives chopping signal fchop4 at 263.

The outputs of second chopper switch 234 are electrically coupled to second transconductance amplifier 236 via signal paths 262a and 262b, and the outputs of second transconductance amplifier 236 are electrically coupled to third chopper switch 238 via amplifier signal paths 264a and 264b. The outputs of third chopper switch 238 are electrically coupled to digital output circuit 240, second capacitors 250 and 252, and the outputs of second DAC 248 via signal paths 266a and 266b. The other sides of second capacitors 250 and 252 are electrically coupled to references, such as ground, at 268 and 270, respectively. Third chopper switch 238 receives chopping signal fchop5 at 265.

The output of digital output circuit 240 is electrically coupled to one side of digitally chopped feedback circuit 212, first DAC 242, and second DAC 248 via digital output signal path 206. Also, the outputs of first transconductance amplifier 230 are electrically coupled to the other side of digitally chopped feedback circuit 212 via analog feedback signal paths 228a and 228b.

In one embodiment, digital output circuit 240 is a multilevel ADC. In one embodiment, digital output circuit 240 is a 5-bit multilevel ADC. In one embodiment, digital output circuit 240 is a multilevel comparator. In one embodiment, digital output circuit 240 is a 5-bit multilevel comparator. In one embodiment, digital output circuit 240 can be replaced with a comparator and first DAC 242 and second DAC 248 provide the digital output signal DOUT at 206 to digitally chopped feedback circuit 212.

Digitally chopped feedback circuit 212 includes a digital chopping circuit 272, an integrator circuit 274, and a DAC circuit 276. Digital chopping circuit 272 receives chopping signal fchop2 at 277 and is electrically coupled to digital output circuit 240 via digital output signal path 206. The other side of digital chopping circuit 272 is electrically coupled to integrator circuit 274, which is electrically coupled to the digital input side of DAC circuit 276 via DAC input path 278. The analog output of DAC circuit 276 is electrically coupled to first transconductance amplifier 230 and first chopper 232 via analog feedback signal paths 228a and 228b.

Spinning Hall plate sensor system 208 provides input signals INP at 204. Current source 216 provides a current through spinning Hall plate sensor 214 that is situated in magnetic field B. Spinning Hall plate sensor 214 senses magnetic field B and provides input signals INP at 204 that correspond to magnetic field B. Spinning Hall plate contacts 220 and 222 and input signal paths 204a and 204b rotate, from one corner to another corner of the spinning Hall plate sensor 214, to spin the sensor in magnetic field B and reduce offsets. In one embodiment, magnetic field B corresponds to a current and spinning Hall plate sensor system 208 magnetically senses the current and provides the corresponding input signals INP at 204.

Chopped ADC 210 receives the input signals INP at 204 and provides the digital output signals DOUT at 206. Analog chopping circuit 224 chops the input signals INP at 204 via chopping signal fchop1 at 225 to produce chopped or modulated input signals. Chopped, sigma delta ADC 202 receives the chopped or modulated input signals at first transconductance amplifier 230. The outputs of first transconductance amplifier 230 are combined with the analog feedback signals at 228a and 228b. First chopper switch 232 receives and chops the combined signals via chopping signal fchop3 at 261. The outputs of first chopper switch 232 are integrated with the analog outputs of first DAC 242 via first capacitors 244 and 246. Second chopper switch 234 receives the integrated signal and chops the integrated signal via chopping signal fchop4 at 263. Second transconductance amplifier 236 receives the chopped integrated signal and third chopper switch 238 receives the outputs from second transconductance amplifier 236, where third chopper switch 238 chops the outputs of second transconductance amplifier 236 via chopping signal fchop5 at 265. The outputs of third chopper switch 238 are integrated with the analog outputs of second DAC 248 via second capacitors 250 and 252. Digital output circuit 240 receives and converts this integrated signal into the digital output signals DOUT at 206, which are fed back to first DAC 242 and second DAC 248 for adjusting the digital output signals DOUT at 206. Digital output signals DOUT at 206 include a DC signal component overlaid with an AC error signal that includes a chopping error at the chopper frequency or chopper frequencies. This AC error signal in the digital output signals DOUT at 206 is a ripple error signal. Digital output signals DOUT at 206 are fed back via digitally chopped feedback circuit 212 to reduce ripple error in the digital output signals DOUT at 206.

Digitally chopped feedback circuit 212 receives the digital output signals DOUT at 206 and provides an analog feedback signal at 228a and 228b. Digital chopping circuit 272 receives the digital output signals DOUT at 206 and provides DC error signals that represent the AC ripple error in the digital output signals DOUT at 206. In one embodiment, analog chopping circuit 224, first chopping circuit 232, second chopping circuit 234, third chopping circuit 238, and digital chopping circuit 272 chop at synchronized chopping frequencies, such as integer multiples of one another. In one embodiment, analog chopping circuit 224, first chopping circuit 232, second chopping circuit 234, third chopping circuit 238, and digital chopping circuit 272 chop at the same chopping frequency. In one embodiment, analog chopping circuit 224, first chopping circuit 232, second chopping circuit 234, third chopping circuit 238, and/or digital chopping circuit 272 chop at higher frequencies during a system start up period and at lower frequencies after the system start up period, where chopping at lower frequencies reduces chopping noise and error. In one embodiment, analog chopping circuit 224, first chopping circuit 232, second chopping circuit 234, third chopping circuit 238, and/or digital chopping circuit 272 chops at higher frequencies for larger input signals INP at 204 and at lower frequencies for smaller input signals INP at 204, where chopping at lower frequencies reduces chopping noise and error.

To provide DC error signals with smaller chopping peaks, chopping of analog chopping circuit 224 via chopping signal fchop1 and chopping of digital chopping circuit 272 via chopping signal fchop2 is controlled to compensate for the delay through chopped, sigma delta ADC 202 and the settling time of chopped, sigma delta ADC 202. In one embodiment, chopping signal fchop2 is delayed in relation to chopping signal fchop1 to compensate for the delay and the settling time of chopped, sigma delta ADC 202. In one embodiment, chopping of digital chopping circuit 272 via chopping signal fchop2 is guardbanded to prevent signals from passing through digital chopping circuit 272 during the delay and settling time of chopped, sigma delta ADC 202 after switching analog chopping circuit 224. In one embodiment, chopping signal fchop2 at 277 is delayed in relation to chopping signal fchop1 at 225 via a delay circuit between signal lines 225 and 277. In one embodiment, chopping signal fchop2 at 277 is guardbanded in relation to chopping signal fchop1 at 225 via a guardbanding circuit.

In one embodiment, digital chopping circuit 272 multiplies one value of the digital output signals DOUT at 206 by plus (or positive) one in one chopping phase and the next value of the digital output signals DOUT at 206 by minus (or negative) one in the next chopping phase, where digital chopping circuit 272 alternates between multiplying the digital output signals DOUT at 206 by positive one and multiplying the digital output signals DOUT at 206 by negative one during different chopping phases. Digital chopping circuit 272 sums the multiplication results in consecutive chopping phases to provide the DC error signals. In one embodiment, digital chopping circuit 272 multiplies the digital output signals DOUT at 206 by negative one via inverting the digital output signals DOUT at 206.

Integrator circuit 274 receives the DC error signals from digital chopping circuit 272 and accumulates the DC error signals to provide an accumulated error signal at 278. In one embodiment, integrator circuit 272 digitally sums the DC error signals to provide the accumulated error signal. In other embodiments, integrator circuit 274 can be any suitable low pass filter.

DAC circuit 276 receives the accumulated error signal and converts the accumulated error signal into an analog feedback signal at 228a and 228b. This analog feedback signal at 228a and 228b is combined with the output of first transconductance amplifier 230 to reduce ripple error in the digital output signals DOUT at 206. Thus, the offset of chopped ADC 210 is reduced and the input signals INP at 204 are not influenced because the feedback is inserted after analog chopping switch 224. This process continues, where the accumulated error signal continues to accumulate and the analog feedback signal at 228a and 228b is adjusted accordingly to eliminate or reduce ripple error in the digital output signals DOUT at 206. In one embodiment, integrator circuit 274 freezes the accumulated error signal for a period of time, such as seconds or minutes, which reduces chopping errors or artifacts. In one embodiment, DAC circuit 276 includes a current steering circuit for providing the analog feedback signal at 228a and 228b. In one embodiment, DAC circuit 276 includes a pulse width DAC for providing the analog feedback signal at 228a and 228b. In one embodiment, DAC circuit 276 includes a voltage divider circuit for providing the analog feedback signal at 228a and 228b.

Figure 4:
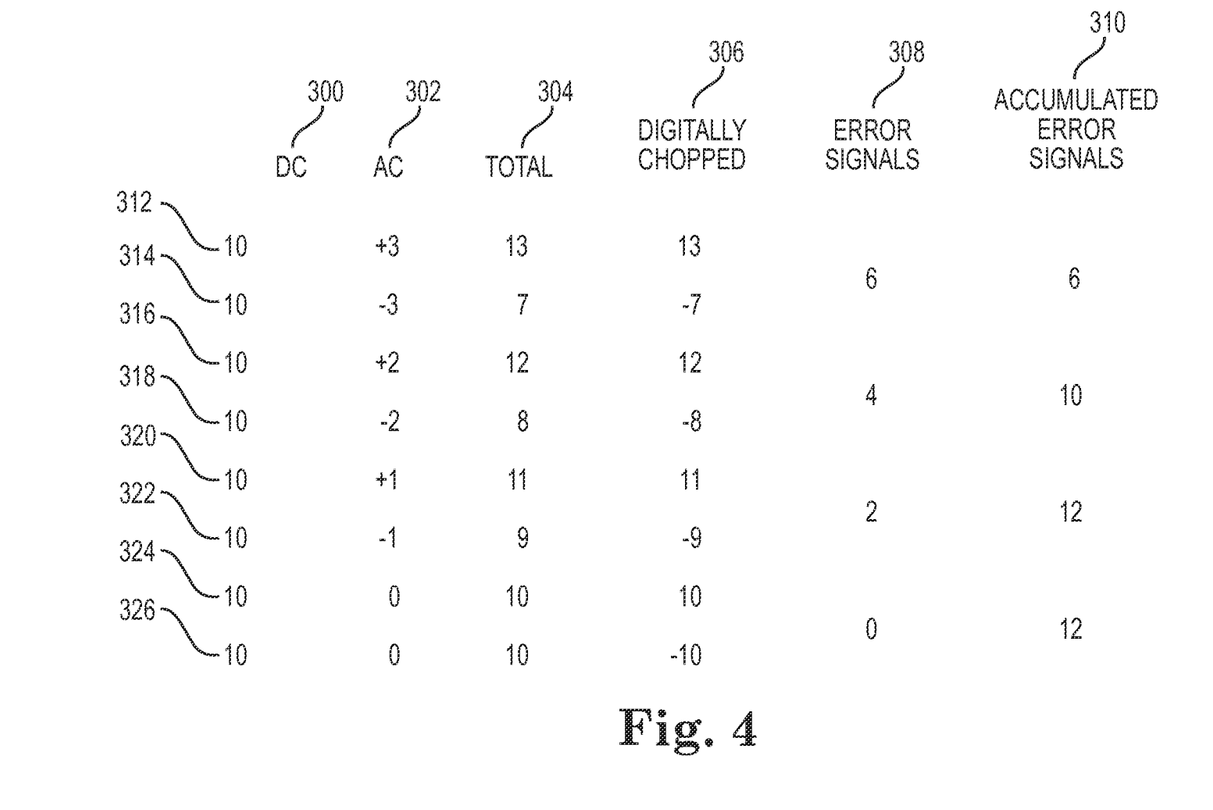
FIG. 4 is a table for describing the operation of one embodiment of a feedback circuit.

FIG. 4 is a table for describing the operation of one embodiment of a feedback circuit, such as feedback circuit 30, digitally chopped feedback circuit 110, and digitally chopped feedback circuit 212. Digital output signals DOUT can be divided into a DC signal at 300 and an AC error signal at 302 that is overlaid on the DC signal at 300 to provide the total signal value at 304. The digital chopping circuit, such as digital chopping circuit 130 or 272, chops the digital output signals DOUT to provide the digitally chopped signals at 306 and the DC error signals at 308. An integrator, such as integrator 132 or 274, accumulates the error signals at 308 to provide the accumulated error signals at 310.

Initially, the digital output signals DOUT include larger ripple error signals, which are reduced via the feedback circuit, such as feedback circuit 30, 110, or 212. In this example, the DC signal at 300 is 10. At 312, the AC error signal at 302 is plus 3 and the total signal at 304 is 13. This total signal at 304 is multiplied by plus one to provide the digitally chopped signal at 306 of plus 13. In the next chopping phase, at 314, the AC error signal at 302 is minus 3 and the total signal at 304 is 7. This total signal at 304 is multiplied by minus one to provide the digitally chopped signal at 306 of minus 7. The digitally chopped signals at 306 of plus 13 and minus 7 are summed to provide the error signal at 308 of 6. Assuming the integrator begins at a value of 0, the accumulated error signal at 310 is 6. The DAC, such as DAC 134 or DAC 276, receives the accumulated error signal at 310 of 6 and feeds back an analog feedback signal to the ADC, which adjusts the digital output signals DOUT, accordingly. In one embodiment, the DAC provides an analog feedback signal that is 1/100 the value of the accumulated error signal at 310.

In the next chopping phase, at 316, the AC error signal at 302 is plus 2 and the total signal at 304 is 12. This total signal at 304 is multiplied by plus one to provide the digitally chopped signal at 306 of plus 12. In the next chopping phase, at 318, the AC error signal at 302 is minus 2 and the total signal at 304 is 8. This total signal at 304 is multiplied by minus one to provide the digitally chopped signal at 306 of minus 8. The digitally chopped signals at 306 of plus 12 and minus 8 are summed to provide the error signal at 308 of 4. The accumulated error signal at 310 is increased to 10 and the DAC receives the accumulated error signal at 310 of 10 and feeds back the analog feedback signal to the ADC, which again adjusts the digital output signals DOUT.

In the next chopping phase, at 320, the AC error signal at 302 is plus 1 and the total signal at 304 is 11. This total signal at 304 is multiplied by plus one to provide the digitally chopped signal at 306 of plus 11. In the next chopping phase, at 322, the AC error signal at 302 is minus 1 and the total signal at 304 is 9. This total signal at 304 is multiplied by minus one to provide the digitally chopped signal at 306 of minus 9. The digitally chopped signals at 306 of plus 11 and minus 9 are summed to provide the error signal at 308 of 2. The accumulated error signal at 310 is increased to 12 and the DAC receives the accumulated error signal at 310 of 12 and feeds back the analog feedback signal to the ADC, which again adjusts the digital output signals DOUT.

In the next chopping phase, at 324, the AC error signal at 302 is 0 and the total signal at 304 is 10. This total signal at 304 is multiplied by plus one to provide the digitally chopped signal at 306 of plus 10. In the next chopping phase, at 326, the AC error signal at 302 is 0 and the total signal at 304 is 10. This total signal at 304 is multiplied by minus one to provide the digitally chopped signal at 306 of minus 10. The digitally chopped signals at 306 of plus 10 and minus 10 are summed to provide the DC error signal at 308 of 0. The accumulated error signal at 310 remains at 12 and the DAC receives the accumulated error signal at 310 of 12 and feeds back the analog feedback signal to the ADC. The process continues adjusting the accumulated error signals and the feedback signals.

In one embodiment, after settling of the feedback loop, the accumulated error signal is frozen or stored for a period of time, such as seconds or minutes, to reduce chopping artifacts. In one embodiment, after settling of the feedback loop, the chopping frequency or chopping frequencies are reduced to reduce chopping artifacts. In one embodiment, after settling of the feedback loop, the chopping frequency or chopping frequencies are switched off to reduce chopping artifacts.

System 20 and sensor systems 100 and 200 provide a number of benefits, such as lower residual offset and lower noise. Also, using a digital low pass filter in the feedback loop, instead of an analog low pass filter, greatly reduces the integrated circuit chip area of the systems. In addition, using a digital low pass filter in the feedback loop enables switching to lower chopping frequencies to reduce chopping artifacts, and the digital to analog feedback system does not influence the input signals or signal speeds and less dynamic range is needed in the ADC.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system, comprising:
   a first circuit configured to provide input signals;
   a second circuit configured to receive the input signals and provide digital output signals that correspond to the input signals; and
   a feedback circuit, comprising:
      a chopping circuit;
      an integrator circuit; and
      a digital-to-analog converter circuit configured to convert an error signal into an analog signal that is received by the second circuit to reduce ripple error.

2. The system of claim 1, wherein the chopping circuit is configured to alternate between multiplying the digital output signals by positive one and multiplying the digital output signals by negative one during different chopping phases.

3. The system of claim 2, wherein the chopping circuit sums multiplication results in consecutive chopping phases to provide the error signals.

4. The system of claim 1, wherein the second circuit comprises at least one analog chopping circuit, and the chopping circuit and the at least one analog chopping circuit are configured to chop at higher frequencies during a system start up period and at lower frequencies after the system start up period.

5. The system of claim 1, wherein the second circuit comprises at least one analog chopping circuit, and the chopping circuit and the at least one analog chopping circuit are configured to chop at higher frequencies for larger input signals and at lower frequencies for smaller input signals.

6. The system of claim 1, wherein the integrator circuit digitally sums error signals to provide an accumulated error signal.

7. The integrated circuit of claim 1, the first circuit comprising:
   a spinning Hall plate sensor configured to sense a magnetic field and provide the input signals that correspond to the magnetic field.

8. A magnetic sensor system, comprising:
   a spinning Hall sensor configured to sense a magnetic field and provide input signals that correspond to the magnetic field;
   a circuit that receives the input signals and provides corresponding digital output signals comprising:
      an analog chopping circuit; and
      a chopped sigma delta analog-to-digital converter circuit; and
   a feedback circuit comprising:
      a chopping circuit configured to alternate between multiplying the digital output signals by positive one and multiplying the digital output signals by negative one during different chopping phases and to sum multiplication results in consecutive chopping phases to provide error signals that represent ripple error in the digital output signals;
      an integrator circuit configured to provide an accumulated error signal; and
      a digital-to-analog converter circuit configured to convert the accumulated error signal into an analog signal that is received by the circuit to reduce the ripple error.

9. The system of claim 8, wherein the analog chopping circuit and the chopping circuit are configured to chop at higher frequencies during a system start up period and at lower frequencies after the system start up period.

10. The system of claim 8, wherein the analog chopping circuit and the chopping circuit are configured to chop at higher frequencies for larger input signals and at lower frequencies for smaller input signals.

* * * * *